(12) United States Patent
McKenzie et al.

(10) Patent No.: US 7,089,140 B1
(45) Date of Patent: Aug. 8, 2006

(54) PROGRAMMABLE LOGIC DEVICE AND METHOD OF TESTING A PROGRAMMABLE LOGIC DEVICE

(75) Inventors: Graham McKenzie, Kirby Muxloe (GB); Joel A. Seely, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 42 days.

(21) Appl. No.: 10/923,527

(22) Filed: Aug. 20, 2004

(51) Int. Cl.
*G01M 19/00* (2006.01)

(52) U.S. Cl. .................. 702/122; 702/123; 702/119; 714/725; 714/739; 716/16; 716/17

(58) Field of Classification Search .............. 702/122, 702/108, 119, 121, 123; 714/30, 725, 739, 714/41; 703/16; 716/16–18, 2–5
See application file for complete search history.

(56) References Cited

U.S. PATENT DOCUMENTS

| | | | |
|---|---|---|---|
| 6,704,889 B1 * | 3/2004 | Veenstra et al. | 714/39 |
| 2004/0098638 A1 * | 5/2004 | Rally et al. | 714/27 |

* cited by examiner

*Primary Examiner*—Bryan Bui
*Assistant Examiner*—Hlen Vo
(74) *Attorney, Agent, or Firm*—Townsend and Townsend and Crew LLP

(57) ABSTRACT

A programmable logic device includes a functional block, which does not form part of an embedded processor, which can perform a testing function on other functional blocks of the programmable logic device. Thus, the test block can read stored data values from registers in the other functional blocks of the programmable logic device, or can read signal values at points in the other functional blocks of the programmable logic device, or can insert specific data values in registers in the other functional blocks of the programmable logic device.

18 Claims, 3 Drawing Sheets

PROGRAMMABLE LOGIC DEVICE AND METHOD OF TESTING A PROGRAMMABLE LOGIC DEVICE

TECHNICAL FIELD OF THE INVENTION

This invention relates to a programmable logic device, and in particular to a method of testing such a device. More specifically, the invention relates to a method of testing the operation of functional blocks implemented within a programmable logic device, and to a programmable logic device which is able to implement the method.

BACKGROUND OF THE INVENTION

Programmable logic devices are in common use, in which an array of logic elements can be configured to perform a desired set of functions. Programmable logic devices have a number of inputs and outputs, and may also contain specialized memory blocks as well as other blocks having particular specialized functions, in addition to the array of logic elements. The connections between the logic elements of the array, and the connections between the logic elements and the other blocks of the programmable logic device, are then determined by configuration data.

That is, the configuration data may determine that certain specific logic elements of the array will operate together to perform a specific desired function.

Programmable logic devices are therefore widely used to implement complex electronic products. The designer of such a product needs to be able to test the effects of a set of configuration data during the design process. That is, the designer may produce a first set of configuration data, and will then need to test the functionality of the programmable logic device when configured by that set of configuration data. Depending on the results of the test, the designer will then be able either to modify or expand the set of configuration data, in order to modify or expand the resulting functionality.

It is becoming common to use a programmable logic device with an embedded processor. That is, some of the logic elements of the array are configured such that they form a microprocessor, which can then run software in a generally conventional way.

Thus, programmable logic devices available from Altera Corporation can be used to implement a microprocessor, which is available under the trademark Nios®.

It is also known that, in the case of a programmable logic device with an embedded processor, the processor can be used to debug the device during operation. That is, while a design implemented in the programmable logic device is in operation, the processor can stop the process and, for example, examine the contents of the registers which are in use. This information can then be used to test whether the device is operating as intended. If not, the configuration data can be modified, the design can be changed, and the test procedure can be carried out again.

However, implementing an embedded processor can use a significant proportion of the resources of the programmable logic device. Therefore, it can be disadvantageous to have to implement an embedded processor for testing and debugging purposes, when the design does not otherwise require that an embedded processor should be implemented.

SUMMARY OF THE INVENTION

The present invention therefore seeks to provide a programmable logic device, which can be used to implement a method of debugging, requiring the use of fewer resources on the device.

More specifically, according to a first aspect of the present invention, there is provided a programmable logic device, comprising a functional block, separate from any embedded processor, which can perform a testing function on other functional blocks of the programmable logic device. Thus, the test block can read stored data values from registers in the other functional blocks of the programmable logic device, or can read signal values at points in the other functional blocks of the programmable logic device, or can insert specific data values in registers in the other functional blocks of the programmable logic device.

DETAILED DESCRIPTION OF PREFERRED EMBODIMENTS

Figure 1:
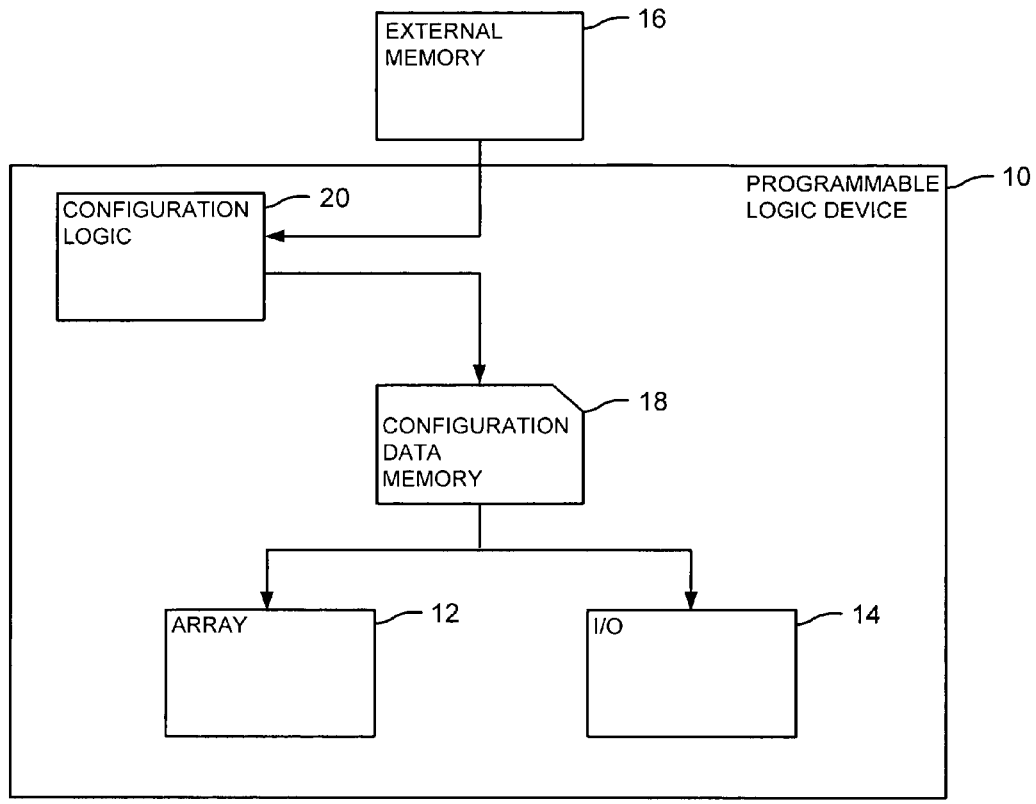
FIG. 1 is a block schematic diagram of a programmable logic device in accordance with the present invention.

FIG. 1 is a block schematic diagram of a programmable logic device in accordance with the invention. As is conventional, the programmable logic device is based around an array 12 of programmable logic elements and input/output devices 14. The connections between the programmable logic elements of the array 12, and the connections between the programmable logic elements of the array 12 and the input/output devices 14, are determined by configuration data, which in use of the device is obtained from an external memory 16, and stored in a configuration memory 18, under the control of configuration logic 20.

As is conventional, the configuration data can cause connections to be made between the programmable logic elements of the array 12, and between the programmable logic elements of the array 12 and the input/output devices 14, such that desired functional blocks are implemented in the programmable logic device 10, and hence such that the programmable logic device 10 has a desired functionality.

Figure 2:
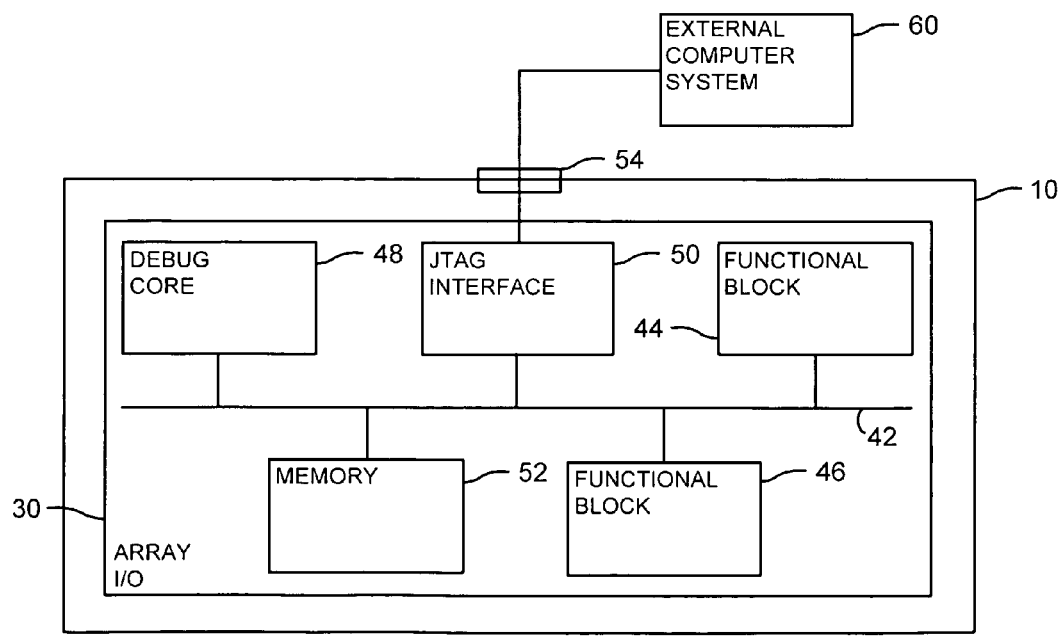
FIG. 2 is a diagram illustrating an implementation of a device in the programmable logic device of FIG. 1.

FIG. 2 is a functional block diagram, showing an implementation of a particular desired functionality in a programmable logic device, according to the preferred embodiment of the present invention.

As shown in FIG. 2, the array 12 and the input/output devices 14 are shown as a single block 30, and the connections between the programmable logic elements of the array 12, and between the programmable logic elements of the array 12 and the input/output devices 14, are such that the required functionality of the device is implemented in the device.

More specifically, a bus 42 is implemented, and various functional blocks are connected to the bus 42. In this illustrated embodiment of the invention, the various functional blocks include a first functional block 44, a second functional block 46, a debug core 48, a JTAG interface 50 and a memory 52.

The functional blocks 44, 46 may, for example, be peripheral blocks which act as interfaces to external devices, such as a USB interface, or memory controllers, for controlling accesses to external memory devices, or DMA (Direct Memory Access) controllers, or bus bridges, for controlling the transfer of data between the bus 42 and another bus within the device. Where there is another bus within the device, other functional blocks can be connected to that bus instead of to the bus 42.

Alternatively, the functional blocks 44, 46 may be functional blocks for performing specific functions on input data to be processed. For example, where the device is to be used in a signal processing application, one of the peripheral blocks may be a filter block for filtering received data.

Although only two peripheral blocks 44, 46 are shown in FIG. 2, it will be appreciated that the system 10 may include any desired number of such peripheral blocks.

In this illustrated embodiment of the invention, there is also provided a memory 52, which may be implemented from the logic elements in the array 12, or can be provided in the form of specialized memory blocks.

As shown in FIG. 2, a debug core block 48 is also implemented in the device. The debug core block is connected to the bus 42. In addition, a JTAG interface 50 is implemented. By contrast with the prior art system, in which an embedded processor is implemented, and provided with a debugging capability, the debug core block 48 uses substantially fewer of the programmable logic resources of the programmable logic device.

An external computer system 60 can then be connected to the JTAG interface 50 in a conventional way through JTAG pins 54. As is conventional in programmable logic devices, the JTAG pins 54 can be used for downloading configuration data from the external computer system 60 in order to configure the device in a particular way. In addition, as described further below, the external computer system can be used to test and debug the device during a design phase.

As is common, the external computer system 60 may include user input devices, for example a keyboard and mouse, and also includes a user display. In accordance with an aspect of the present invention, the external computer system 60 runs software, which allows the user to test and debug the design implemented in the device 10, in conjunction with the debug core block 48 in the device.

Figure 3:
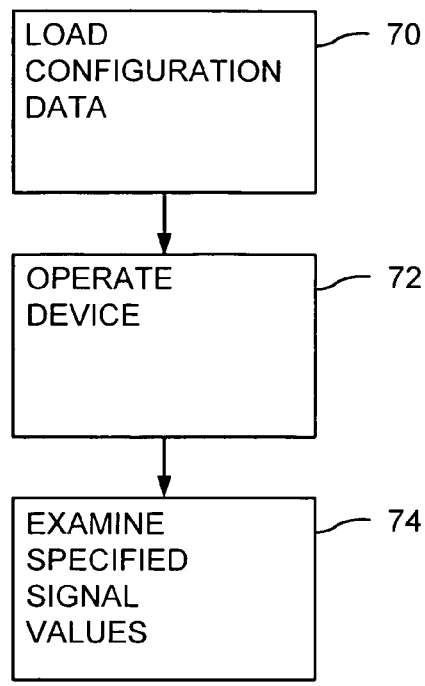
FIG. 3 is a flow chart, illustrating a first method of testing the device of FIG. 2, in accordance with an aspect of the present invention.
Figure 4:
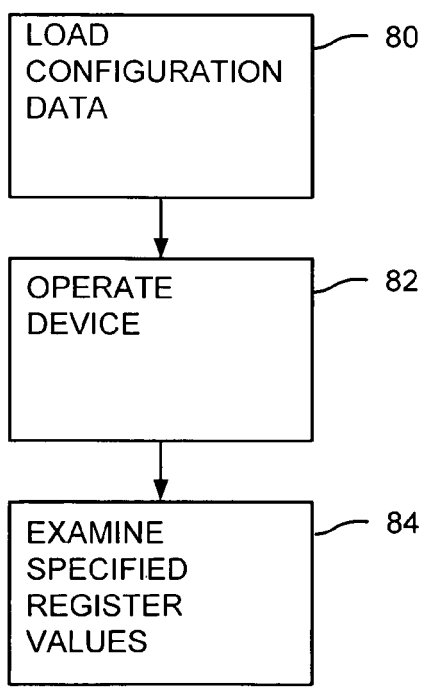
FIG. 4 is a flow chart, illustrating a second method of testing the device of FIG. 2, in accordance with an aspect of the present invention.
Figure 5:
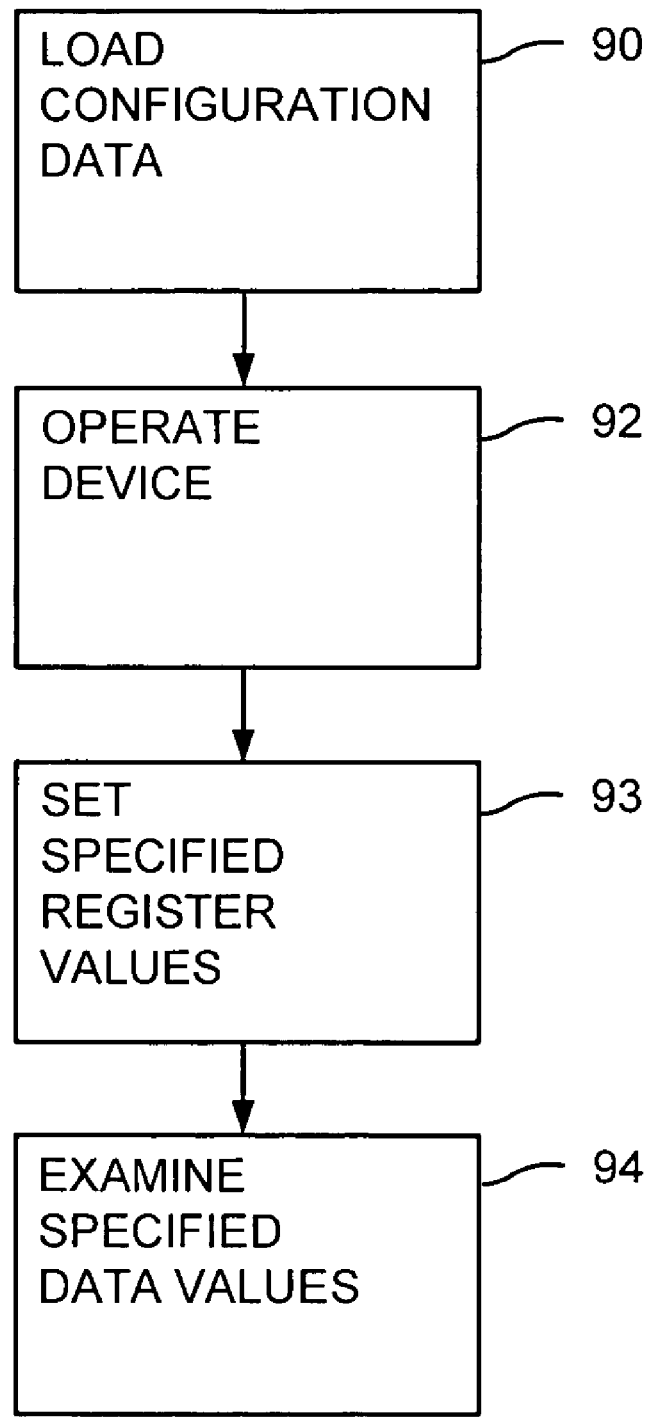
FIG. 5 is a flow chart, illustrating a third method of testing the device of FIG. 2, in accordance with an aspect of the present invention.

FIGS. 3, 4 and 5 are flow charts, illustrating testing procedures in accordance with a further aspect of the present invention, using the software running on the external computer system 60 and the debug core block 48.

As will be described in more detail below, the software running on the external computer system 60 allows the user to determine the status of the device 10 at any point in its operation. Moreover, the software allows the user to set specific operating conditions for the device 10, and then to monitor the operation of the device 10 under those operating conditions.

A software product, which allows a user to perform similar functions when the device includes an Altera® Nios® II processor, is available from First Silicon Solutions, Inc. In accordance with aspects of the present invention, the device 10 does not include any embedded processor, and hence the debug core block 48 operates separately from any processor, and the person of ordinary skill in the art will recognize the modifications, which must be made to that existing software product, in order to allow its use in the present invention.

As shown in FIG. 3, in a first testing procedure, in step 70, configuration data is loaded into the programmable logic device 10 in a conventional way, in order to implement a particular device configuration. In step 72, operation of the device is begun.

In step 74, based on a user input to the external computer system 60, the software running on the external computer system 60 causes a command to be sent via the JTAG pins 54 and JTAG interface 50 to the debug core 48. The debug core is then able to act on this command, in step 74 of the procedure, to examine a value of a specified signal at a specified point in time. For example, the signal may be a signal passing between two of the functional blocks 44, 46 in the design, or may be a signal at a specified point in one of the functional blocks 44, 46. More specifically, the debug core 48 can act as a bus master, to cause the requested data to be sent to it.

As shown in FIG. 4, in a second testing procedure, in step 80, configuration data is again loaded into the programmable logic device 10 in a conventional way, in order to implement a particular device configuration. In step 82, operation of the device is begun.

In step 84, based on a user input to the external computer system 60, the software running on the external computer system 60 causes a command to be sent via the JTAG pins 54 and JTAG interface 50 to the debug core 48. The debug core is then able to act on this command, in step 84 of the procedure, to examine a value contained in a specified register at a specified point in time. For example, the register may contain data which is being generated in one of the functional blocks 44, 46 in the design, or may contain data which is being operated on in one of the functional blocks 44, 46. As before, the debug core 48 can act as a bus master, to cause the requested data to be sent to it.

In exactly the same way, the debug core can act as a bus master to read a value stored in the memory 52, which may or may not be used by one or more of the other functional blocks.

The procedures shown in FIGS. 3 and 4 therefore allow the user to test the operation of the device 10, as implemented by the present set of configuration data, in real time, while it is actually in use.

In some cases, it is desirable to be able to test during product development that devices operate correctly, in situations which may occur only rarely in practice. FIG. 5 shows a testing procedure which allows such rare situations to be created, and then allows the user to test the resulting operation of the device 10, as implemented by the present set of configuration data, in real time, while it is actually in use.

As shown in FIG. 5, in a third testing procedure, in step 90, configuration data is loaded into the programmable logic device 10 in a conventional way, in order to implement a particular device configuration. In step 92, operation of the device is begun.

In step 93, based on a user input to the external computer system 60, the software running on the external computer system 60 causes a command to be sent via the JTAG pins 54 and JTAG interface 50 to the debug core 48. The debug core is then able to act on this command, in step 93 of the procedure, to set a value stored in a specified register to equal a particular value. More generally, the debug core 48 is able to set the values stored in any number of specified registers to equal particular values.

These specified registers may for example contain variables relating to particular inputs of the functional blocks 44, 46 of the device that are not accessible at the external pins of the device, and storing specific values in these registers can then be used to test the operation of the device in response to that particular combination of inputs, even though that combination may occur rarely in practice. The debug core 48 can act as a bus master, to cause the required data to be sent to the register or registers as desired.

In exactly the same way, the debug core can act as a bus master to read a value stored in the memory 52, which may or may not be used by one or more of the other functional blocks.

Then, as before, in step 94, based on a further user input to the external computer system 60, the software running on the external computer system 60 causes a further command to be sent via the JTAG pins 54 and JTAG interface 50 to the debug core 48. The debug core is then able to act on this further command, in step 94 of the procedure, to examine a value of a specified signal at a specified point in time. For example, the signal may be a signal passing between two of the functional blocks 44, 46 in the design, or may be a signal at a specified point in one of the functional blocks 44, 46. Alternatively, the further command can be such that the debug core is then able to act on this further command, in step 94 of the procedure, to examine a value stored in one or more of the registers in the device. This one or more of the registers may be the same as the resister or registers, in which particular values have been stored, or may be different.

Thus, the debug core 48 can again act as a bus master, to cause the requested data to be sent to it.

There is therefore described a debug core, which can be implemented in a programmable logic device, in order to allow a user operating an external computer system to obtain information about the status of other components implemented in the programmable logic device. The debug core can be implemented in the programmable logic device by means of configuration data, which can be downloaded into the programmable logic device from a remote computer system.

The invention claimed is:

1. A programmable logic device, comprising:
a plurality of functional blocks;
an interface for connection to an external computer system;
a test block, wherein the test block is separate from any processor implemented in the programmable logic device, and wherein the test block is able to receive commands received from the external computer system via said interface, and wherein, in response to commands received from the external computer system via said interface, said test block is able to monitor operation of said functional blocks; and
a bus, for interconnecting said plurality of functional blocks and said test block, wherein, in response to commands received from the external computer system via said interface, said test block is able to act as a bus master to control at least one of said plurality of functional blocks.

2. A programmable logic device as claimed in claim 1, wherein said interface for connection to an external computer system is a JTAG interface.

3. A programmable logic device as claimed in claim 1, wherein, in response to commands received from the external computer system via said interface, said test block is able to act as a bus master to read the value of a signal appearing at least one location in at least one of said plurality of functional block.

4. A programmable logic device as claimed in claim 1, wherein, a response to commands received from the external computer system via said interface, said test block is able to act as a bus master to read a value stored in at least one register in at least one of said plurality of functional blocks.

5. A programmable logic device as claimed in claim 1, wherein, in response to commands received from the external computer system via said interface, said test block is able to act as a bus master to read a value stored in at least one memory of the programmable logic device.

6. A programmable logic device as claimed in claim 1, wherein, in response to commands received from the external computer system via said interface, said test block is able to act as a bus master to store a desired value in at least one register in at least one of said plurality of functional blocks.

7. A programmable logic device as claimed in claim 1, wherein, in response to commands received from the external computer system via said interface, said test block is able to act as a bus master to store a desired value in at least one memory of the programmable logic device.

8. A computer system, comprising:
a computer system, running a test software product; and
a programmable logic device,
wherein said programmable logic device comprises:
a plurality of functional blocks;
an interface for connection to an external computer system;
a test block, wherein the test block is separate from any processor implemented in the programmable logic device,
wherein, in response to user inputs, said computer system is able to generate commands to be sent to the programmable logic device, and
wherein the test block of the programmable logic device is able to receive said commands received from the external computer system via said interface, and, in response to said commands received from the external computer system via said interface, said test block is able to monitor operation of said functional blocks; and
a bus, for interconnecting said plurality of functional blocks and said test block, wherein, in response to commands received from the external computer system via said interface, said test block is able to act as a bus master to control at least one of said plurality of functional blocks.

9. A method of testing a programmable logic device comprising a plurality of functional blocks, the method comprising:
generating a command in an external computer system;
transmitting said command from said external computer system to said programmable logic device; and
in a test block of said programmable logic device, wherein the test block is separate from any processor implemented in the programmable logic device, translating said command such that said test block is able to monitor operation of said functional blocks,
wherein said test block of said programmable logic device is connected to said plurality of functional blocks by means of a bus, and wherein said step of translating said command comprises causing said test block to act as a master on said bus.

10. A method as claimed in claim 9, wherein said test block is able to act as a bus master to read the value of a signal appearing at at least one location in at least one of said plurality of functional blocks.

11. A method as claimed in claim 9, wherein said test block is able to act as a bus master to read a value stored in at least one register in at least one of said plurality of functional blocks.

12. A method as claimed in claim 9, wherein said test block is able to act as a bus master to store a desired value in at least one register in at least one of said plurality of functional blocks.

13. A programmable logic device, comprising:
a plurality of functional blocks;
at least one bus, for interconnecting said plurality of functional blocks;
an interface, for connection to an external computer system; and
a test block, connected to said bus and to said interface, wherein said test block is not able to act as a general purpose microprocessor, and wherein the test block is able to receive commands received from the external computer system via said interface, and wherein, in response to commands received from the external computer system via said interface, said test block is able to act as a master on said bus to transmit data to said functional blocks, and to request data from said functional blocks.

14. A programmable logic device, comprising:
a plurality of functional blocks;
at least one bus, for interconnecting said plurality of functional blocks;
an interface, for connection to an external computer system; and
a test block, connected to said bus and to said interface, wherein the test block is able to perform a testing function by receiving commands from the external computer system via said interface, and, in response to commands received from the external computer system via said interface, by acting as a master on said bus to transmit data to said functional blocks, and to request data from said functional blocks,
wherein said testing function is the sole function of said test block.

15. A programmable logic device, comprising:
a plurality of functional blocks;
at least one bus, for interconnecting said plurality of functional blocks;
an interface, for connection to an external computer system; and
a test block, connected to said bus and to said interface, wherein said test block uses significantly fewer programmable logic resources than a general purpose microprocessor, and wherein the test block is able to receive commands received form the external computer system via said interface, and wherein, in response to commands received from the external computer system via said interface, said test block is able to act as a master on said bus to transmit data to said functional blocks, and to request data from said functional blocks.

16. A programmable logic device, comprising:
a plurality of functional blocks;
a processor capable of monitoring operation of said functional blocks;
an interface for connection to an external computer system;
a test block, wherein the test block is able to receive commands received from the external computer system via said interface, and wherein, in response to commands received from the external computer system via said interface, said test block is able to monitor operation of said functional blocks; and
a bus, for interconnecting said plurality of functional blocks and said test block, wherein, in response to commands received from the external computer system via said interface, said test block is able to act as a bus master to control at least one of said plurality of functional blocks.

17. A programmable logic device as claimed in claim 16, wherein, in response to commands received from the external computer system via said interface, said test block is able to act as a bus master to read the value of a signal appearing at least one location in at least one of said plurality of functional block.

18. A programmable logic device as claimed in claim 16, wherein, in response to commands received from the external computer system via said interface, said test block is able to act as a bus master to store a desired value in at least one register in at least one of said plurality of functional blocks.

* * * * *